United States Patent
Aiba

(10) Patent No.: US 7,948,412 B2
(45) Date of Patent: May 24, 2011

(54) DELTA-SIGMA MODULATOR

(75) Inventor: Yusuke Aiba, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 154 days.

(21) Appl. No.: 12/279,918

(22) PCT Filed: Aug. 21, 2007

(86) PCT No.: PCT/JP2007/066210
§ 371 (c)(1),
(2), (4) Date: Aug. 19, 2008

(87) PCT Pub. No.: WO2008/023710
PCT Pub. Date: Feb. 28, 2008

(65) Prior Publication Data
US 2010/0225517 A1    Sep. 9, 2010

(30) Foreign Application Priority Data
Aug. 23, 2006   (JP) ................................. 2006-226956

(51) Int. Cl.
*H03M 3/00* (2006.01)
(52) U.S. Cl. .......................................... 341/143; 375/265
(58) Field of Classification Search ........... 341/143–155
See application file for complete search history.

(56) References Cited

U.S. PATENT DOCUMENTS

| | | | |
|---|---|---|---|
| 6,507,301 B2 | 1/2003 | Locher | |
| 6,567,025 B2 | 5/2003 | Schreier et al. | |
| 6,744,392 B2 * | 6/2004 | Melanson | 341/143 |
| 6,967,606 B2 * | 11/2005 | Wiesbauer et al. | 341/143 |
| 7,129,866 B2 * | 10/2006 | Bjornsen | 341/143 |
| 7,227,570 B2 | 6/2007 | Sato et al. | |
| 7,283,075 B2 * | 10/2007 | Lu et al. | 341/143 |
| 7,414,557 B2 * | 8/2008 | Andersson et al. | 341/143 |
| 7,474,241 B2 * | 1/2009 | Andre | 341/143 |
| 7,486,217 B2 * | 2/2009 | Matsushita et al. | 341/143 |

(Continued)

FOREIGN PATENT DOCUMENTS
JP    11-027151    1/1999

(Continued)

OTHER PUBLICATIONS

Maruits Ortmanns, Friedel Gerfers, Yiannos Manoli, "Increased Jitter Sensitivity in Continuous-and Discrete-Time ΣΔ Modulators due to finite OpAmp Settling Speed, Circuits and Systems," 2005. ISCAS 2005. IEEE International Symposium on May 23, 2005, vol. 3, p. 2543-2546.

(Continued)

*Primary Examiner* — Lam T Mai
(74) *Attorney, Agent, or Firm* — Finnegan, Henderson, Farabow, Garrett & Dunner, LLP

(57) ABSTRACT

The present invention provides a continuous-time delta-sigma modulator which is configured with an SC (SCR) feedback DA (103) for improving tolerance to jitter for a clock signal and operates stably by maintaining a certain feedback amount without being influenced by a change in a production process thereof or an operating temperature condition thereof. By adjusting a reference voltage Vref that determines an output voltage of the SC feedback DA (103), it is possible to feed back a certain amount of charge from the SC feedback DA (103) to a loop filter (101). Thereby, operation of the delta-sigma modulator is stabilized.

10 Claims, 15 Drawing Sheets

U.S. PATENT DOCUMENTS

2006/0055580 A1  3/2006  Ortmanns et al.

FOREIGN PATENT DOCUMENTS

| | | |
|---|---|---|
| JP | 2000-295049 | 10/2000 |
| JP | 2000-332553 | 11/2000 |
| JP | 2005-535229 | 11/2005 |
| KR | 2003-0094511 | 12/2003 |
| WO | WO 02/063773 A2 | 8/2002 |

OTHER PUBLICATIONS

Maurits Ortmanns, Friedel Gerfers, Yiannos Manoli, "A Continuous-Time Sigma-Delta Modulator with Switched Capacitor Controlled Current Mode Feedback," Solid-State Circuits Conference, 2003. ESSCIRC'03. Proceedings of the 29th European, p. 249-252, Sep. 16, 2003.

Office Action dated Mar. 31, 2010 from Korean Patent Office for corresponding Korean Patent Application No. 10-2008-7021757. 8 pages including 4 pages of translation.

Office Action from Japanese Patent Office for Application No. 2008-530924, mailed Apr. 9, 2010. 7 pages including 4 pages of translation.

M. Ortmanns, et al., "A Continuous-Time ΣΔ Modulator With Reduced Sensitivity to Clock Jitter Through SCR Feedback", IEEE Transactions on Circuits and Systems-I: Regular Papers, vol. 52, No. 5, May 2005, pp. 875-884 (2005).

R. van Veldhoven, "A Triple-Mode Continuous-Time ΣΔ Modulator With Switched-Capacitor Feedback DAC for a GSM-EDGE/CDMA2000/UMTS Receiver", IEEE Journal of Solid-State Circuits, vol. 38, No. 12, Dec. 2003, pp. 2069-2076 (2003).

K. Tiew, et al., "DAC Compensation for Continuous-Time Delta-Sigma Modulators", 2005 IEEE International Symposium on Circuits and Systems (ISCAS), vol. 4, pp. 3680-3683 (2005).

* cited by examiner

DELTA-SIGMA MODULATOR

TECHNICAL FIELD

The present invention relates to a delta-sigma modulator, and particularly to a continuous-time delta-sigma modulator.

BACKGROUND ART

Delta-sigma modulators are divided broadly into a discrete-time delta-sigma modulator and a continuous-time delta-sigma modulator according to a position of a switch for sampling an input signal.

In a case of the continuous-time delta-sigma modulator, a sampling switch is disposed after a loop filter and the loop filter processes a continuous-time signal of an input signal. Thereby, an output of the loop filter is input into a quantizer via the sampling switch and a digital output from this quantizer needs to be fed back continuously to the loop filter after having been converted into an analog signal. Therefore, when there exists a large jitter component in a timing signal for determining timing for the analog conversion of the signal to be fed back to the loop filter, the jitter noise is added to the input signal. That results in a problem that a noise level of the digital output is increased.

As a measure for solving this problem characteristic to the continuous-time delta-sigma modulator and improving tolerance to jitter, it is very effective to use a DAC (digital-analog converter) called an SC (switched-capacitor) feedback DA (or SCR feedback DA) as shown in FIG. 3A, for example (e.g., non-patent reference 1 and non-patent reference 2). Here, the operation principle thereof will be described with reference to FIGS. 2 to 4B.

FIG. 2 shows a continuous-time delta-sigma modulator having an SC feedback DA 103 for a measure to improve the tolerance to jitter. A loop filter 101 receives a continuous-time signal to be processed, supplies an output thereof to a quantizer 102 via a switch SW1 which samples the output in response to a clock CLK, and supplies a digital output from the quantizer 102 to the SC feedback DA 103 as a timing signal for the analog conversion. The SC feedback DA 103 generates a current to be fed back to the loop filter 101 from the digital signal output from the quantizer 102 and a first reference voltage Vref which determines a maximum level of a voltage signal to be fed back.

FIG. 3A is an example of a specific circuit of the feedback DA 103. When a switch SW2 is connected to an a-terminal, charge is once stored in a capacitor Cfb by the reference voltage Vref, and when the switch SW2 is switched to a b-terminal according to the output of the quantizer 102, the charge stored in the capacitor Cfb is fed back to the loop filter 101 via a resistor Rfb. The maximum current value at a moment when the switch SW2 is switched to the b-terminal is Vref/Rfb and then the current value is attenuated with a time constant $\tau = Rfb \times Cfb$ (FIG. 3B).

On the other hand, FIG. 4A shows an example of a specific circuit of another type of the DAC called a SI (switched-current) feedback DA. The SI feedback DA is constituted by a fixed current source 401 and a switch SW3. When the switch SW3 is closed according to the output of the quantizer 102, the charge is fed back to the loop filter 101 by a current Ifb from the fixed current source 401.

Here, since the output of the quantizer 102 is generated in response to the sampling clock CLK, the output of the quantizer 102 has a temporal fluctuation when a jitter is superimposed to this clock CLK. Therefore, a length of a duration in which the charge is fed back to the loop filter 101 has also fluctuation. Thereby, a charge Qsc or Qsi, fed back to the loop filter 101 every CLK period Ts, changes slightly by an effect of this fluctuation. When an amount of this slight change is denoted by $\Delta Qsc$ or $\Delta Qsi$, ratio of $\Delta Qsc$ to Qsc in the feedback DA is outstandingly smaller than ratio of $\Delta Qsi$ to Qsi, where the SC feedback DA feeds back most of the charge to be fed back to the loop filter 101 in the first half of the feed back duration, even compared in the same amount of the fluctuation, as apparent from FIG. 3B or FIG. 4B.

Therefore, the SC feedback DA has the much tolerance to jitter and a very effective circuit for the continuous-time delta-sigma modulator, compared with the SI feed back DA.

Note that a half of the CLK period Ts is represented as the duration for the charge feedback in FIGS. 3B and 4B, the duration is not limited to this value.

Non-patent reference 1: Maurits Ortmanns, "A Continuous-Time $\Sigma\Delta$ Modulator With Reduced Sensitivity to Clock Jitter Through SCR Feedback", IEEE Trans. Circuits Syst. I, Regular Papers, vol. 52, No. 5, MAY 2005

Non-patent reference 2: Robert H. M. van Veldhoven, "A Triple-Mode Continuous-Time $\Sigma\Delta$ Modulator With Switched-Capacitor Feedback DAC for a GSM-EDGE/CDMA2000/UMTS Receiver", IEEE Journal of Solid-State Circuits, vol. 38, No. 12, December 2003

DISCLOSURE OF THE INVENTION

However, the charge amount to be fed back in the above SC feedback DA depends largely on absolute element values of a capacitance and a resistance constituting the DAC, and the feedback charge amount is considerably influenced by a change in a production process thereof, an operating temperature condition thereof, or the like. Thereby, a feedback gain is not stabilized and, in the worst case, a loop becomes unstable due to a shortage of a feedback amount.

Accordingly, in view of the above problem, an object of the present invention is to provide a delta-sigma modulator which operates stably by maintaining a certain feedback amount without being influenced by a change in a production process thereof, an operating temperature condition thereof, or the like.

In the present invention for achieving such an object, the invention according to one embodiment is a delta-sigma modulator, including: an input terminal; a continuous-time loop filter receiving a continuous-time signal from the input terminal; a quantizer for outputting a digital signal obtained by quantizing an output from the continuous-time loop filter in response to a clock; and a switched-capacitor feedback DA converter for outputting an analog signal depending on a first reference voltage according to the digital signal output from the quantizer and feeding back the analog signal to the continuous-time loop filter, said switched-capacitor feedback DA converter having a capacitor and a resistor; wherein the switched-capacitor feedback DA converter attenuating the output signal to be fed back to the continuous-time loop filter according to a time constant determined by the capacitor and the resistor; and the first reference voltage being variable.

The invention preferably includes a controller for controlling feedback of the first reference voltage such that a charge amount to be fed back to the continuous-time loop filter is constant for each clock period.

The invention preferably includes a reference-voltage generating circuit for generating the first reference voltage, the reference-voltage generating circuit including a replica circuit of the switched-capacitor feedback DA converter, a detecting circuit for detecting a signal output from the replica circuit, and a voltage generator for generating a reference voltage based on the signal detected by the detecting circuit, an output from the voltage generator being the first reference voltage and also being input into the replica circuit.

The invention preferably includes a reference-voltage generating circuit for generating the first reference voltage, the reference-voltage generating circuit including a replica circuit of the switched-capacitor feedback DA converter, a smoothing circuit for smoothing a signal output from the replica circuit, and an amplifier for comparing the signal smoothed by the smoothing circuit with a second reference voltage and for amplifying a difference therebetween, an output from the amplifier being the first reference voltage and also being input into the replica circuit.

The invention preferably includes a first feedback-amount detecting circuit for detecting a signal output from the switched-capacitor feedback DA converter, and a reference voltage generator for generating the first reference voltage based on the signal detected by the first feedback-amount detecting circuit.

The invention also preferably includes a delta-sigma modulator wherein the first feedback-amount detecting circuit includes a first smoothing circuit for smoothing the signal output from the switched-capacitor feedback DA converter, and the reference voltage generator includes a switched-current feedback DA converter for DA-converting the digital signal output from the quantizer, a second smoothing circuit for smoothing a signal output from the switched-current feedback DA converter, and a first amplifier for comparing signals output from the first and signals output from second smoothing circuits, an output from the amplifier being the first reference voltage.

The invention may also include a second feedback-amount detecting circuit for detecting the signal output from the quantizer when a reference signal is input to the continuous-time loop filter and a reference voltage generator for generating the first reference voltage based on a signal detected by the second feedback-amount detecting circuit, the reference voltage generator holds the first reference voltage.

Preferably, the second feedback-amount detecting circuit includes a quantizer-output monitor circuit for monitoring the digital signal output from the quantizer and a feedback charge-amount detecting circuit for detecting a charge amount fed back from a difference between an output of the quantizer-output monitor circuit and an output value estimated from the input reference signal, and the reference voltage generator includes a voltage generating circuit for generating a voltage based on an output value of the second feedback-amount detecting circuit; and an output of the voltage generating circuit being the first reference voltage.

The invention may include means for varying a charge amount to be fed back to the continuous-time loop filter for each clock period.

Preferably the second reference voltage is variable.

The continuous-time loop filter of the present invention may be configured with a filter including a resistor, a capacitor and a differential amplifier.

The continuous-time loop filter is of the present invention may be configured with a filter including a transconductance amplifier and a capacitor.

In a still further embodiment the continuous-time loop filter is configured with a first filter having a resistor, a capacitor and a differential amplifier, and a second filter having a transconductance amplifier and a capacitor, with the filters being sequentially connected.

The continuous-time loop filter may be configured with an integrator or a low-pass filter or band-pass filter.

The switched-capacitor feedback DA converter of the present invention may includes a capacitor and a resistor, and may attenuates the output signal to be fed back to the continuous-time loop filter according to a time constant determined by the capacitor and the resistor.

The switched-capacitor feedback DA converter may include a capacitor, a resistor and a transconductance amplifier, and may converts a voltage signal attenuated according to a time constant determined by the capacitor and the resistor into a current with the transconductance amplifier, and may outputs the current to the continuous-time loop filter.

In this embodiment the continuous-time loop filter preferably includes a capacitor and a transconductance amplifier.

Each of the switched-capacitor feedback DA converter and the replica circuit may includes a capacitor, a resistor and a transconductance amplifier, that converts a voltage signal attenuated according to a time constant determined by the capacitor and resistor into a current with the transconductance amplifier, and outputs the current to the continuous-time loop filter.

In this emobidment each of the continuous-time loop filter and the smoothing circuit preferably includes a capacitor and a transconductance amplifier.

According to the present invention, it is possible to provide a delta-sigma modulator which operates stably by maintaining a certain feedback amount without being influenced by a change in a production process thereof, an operating temperature condition thereof, or the like.

BEST MODE FOR CARRYING OUT THE INVENTION

Hereinafter, embodiments of the present invention will be described with reference to the drawings.

First Embodiment

Figure 1:
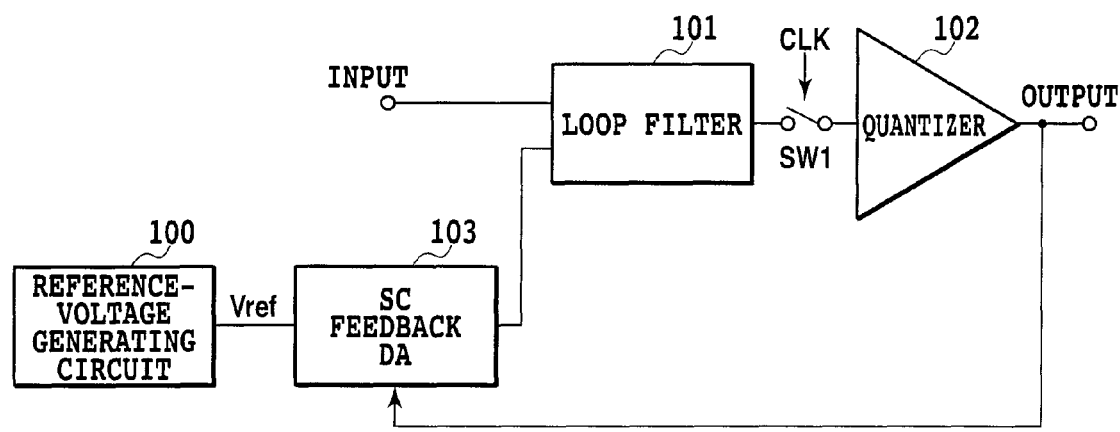
FIG. 1 is a diagram showing a configuration of a delta-sigma modulator according to the present invention.
Figure 2:
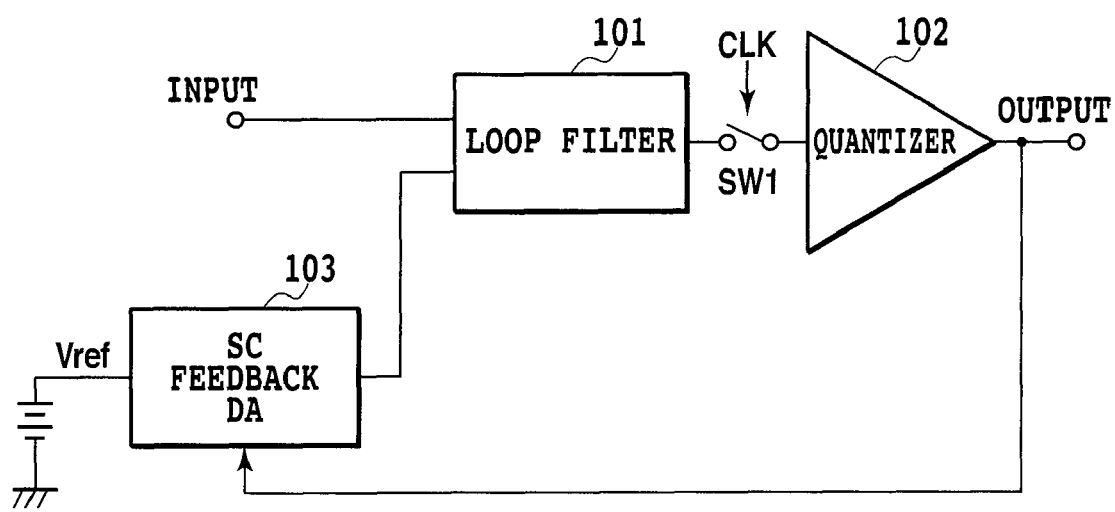
FIG. 2 is a diagram showing a configuration of a conventional delta-sigma modulator having an SC (SCR) feedback DA.

FIG. 1 shows a circuit diagram of a delta-sigma modulator according to an embodiment of the present invention. As shown in FIG. 1, the delta-sigma modulator of the present embodiment includes: a continuous-time loop filter 101 capable of processing a continuous-time signal; a switch SW1 sampling an output signal thereof in response to a clock CLK; a quantizer 102 quantizing a signal obtained via the switch SW1 to output a digital signal; an SC (SCR) feedback DA 103 generating a current to be fed back to the loop filter 101 based on the digital signal output from the quantizer 102 and feeding back the current to the loop filter 101; and a reference-voltage generating circuit 100 generating a first reference voltage Vref which determines a charge amount to be fed back from the feedback DA 103.

Figure 3A:
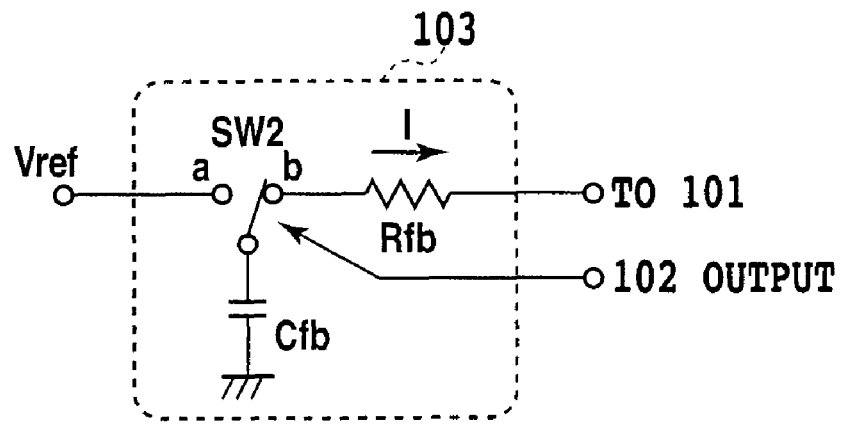
FIG. 3A is a circuit diagram illustrating the SC feedback DA.
Figure 3B:
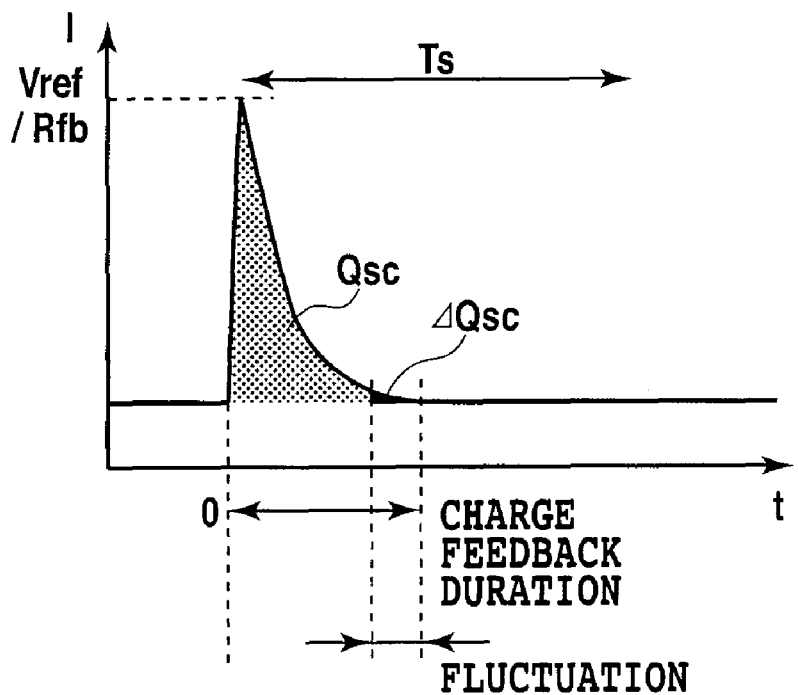
FIG. 3B is a diagram illustrating operation of the SC feedback DA.
Figure 4A:
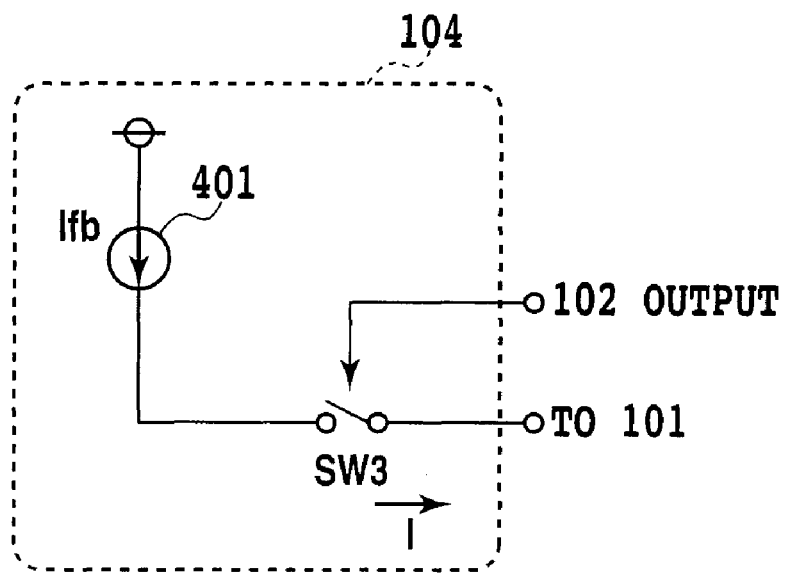
FIG. 4A is a circuit diagram illustrating an SI feedback DA.
Figure 4B:
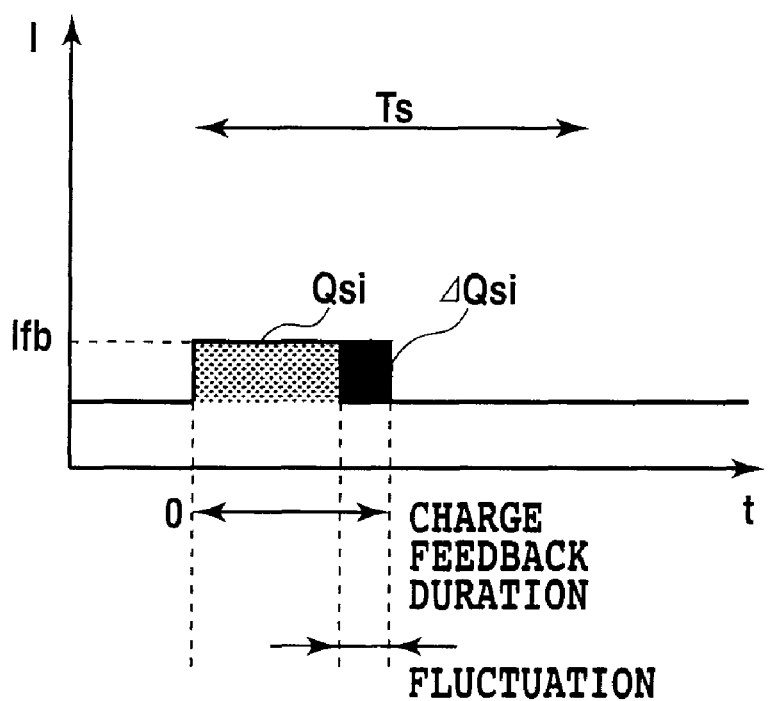
FIG. 4B is a diagram illustrating operation of the SI feedback DA.

There will be described a specific circuit example and circuit operation of the SC feedback DA 103 with reference to FIG. 3A.

The SC feedback DA 103 includes a capacitor Cfb, a resistor Rfb converting a charge stored in the capacitor Cfb into a current, and a switch SW2 which, according to the output signal of the quantizer 102, connects the capacitor Cfb to an a-terminal, that is, the reference voltage Vref while the output signal exhibits a Low (level), and switches so as to connect the capacitor Cfb to a b-terminal, that is, the resistor Rfb while the output signal exhibits a Hi (level).

When the switch SW2 is connected to the a-terminal, a charge is stored in the capacitor Cfb by the reference voltage Vref, and, when the switch SW2 is connected to the b-terminal, the charge is fed back to the loop filter 101. A current I(t=0) at the moment when the switch SW2 is connected to the b-terminal is represented as I (t=0)=Vref/Rfb.

After that, while the switch SW2 is connected to the b-terminal, the current amount fed back to the loop filter 101 is represented by a time constant determined by the capacitor Cfb and the resistor Rfb as follows.

$$I=(Vref/Rfb) \times \exp(-t/\tau)$$

A charge amount Qsc fed back to the loop filter 101 for each clock CLK period Ts is calculated by temporal integral of the above current value in the charge feedback duration as follows.

$$Qsc=\int\{(Vref/Rfb) \times \exp(-t/\tau)\}dt$$

Here, when the time constant τ is assumed to be sufficiently small compared with a length of the charge feedback duration, the following formula is obtained.

$$Qsc=(Vref/Rfb) \times \tau = Vref \times Cfb$$

From the above result, by appropriately adjusting the reference voltage Vref in the reference-voltage generating circuit 100, it is possible to maintain the feedback charge amount Qsc to be constant and to provide a delta-sigma modulator with a stable operation, even when an absolute value of the Cfb varies due to a change in a production process thereof or the value is varied by an operating temperature condition thereof.

Although the above embodiment aims to make a feedback gain to be constant, it may be possible to provide the delta-sigma modulator with a function of a VGA (Variable Gain Amplifier) by intentionally changing the feedback amount.

Here, apparently from the above result, even the capacitor Cfb is appropriately changed, it is also possible to maintain the feedback charge amount Qsc to be constant. For this purpose, it is necessary to divide the capacitor Cfb preliminarily into smaller capacitors and to connect the capacitors in parallel by use of a switch or the like. Since adjustable values in this case are discrete in general, accurate adjustment is obtained by connecting small capacitors in parallel. Also, it is possible to maintain the feedback charge amount Qsc to be constant, by appropriately adjusting the duration for charging or discharging the charge. Here, since a clock CLK period is a very short time like several nano-seconds in a delta-sigma modulator or the like treating a high speed signal, the control of the feedback charge amount Qsc is realized by controlling this time accurately.

Second Embodiment

Figure 5:
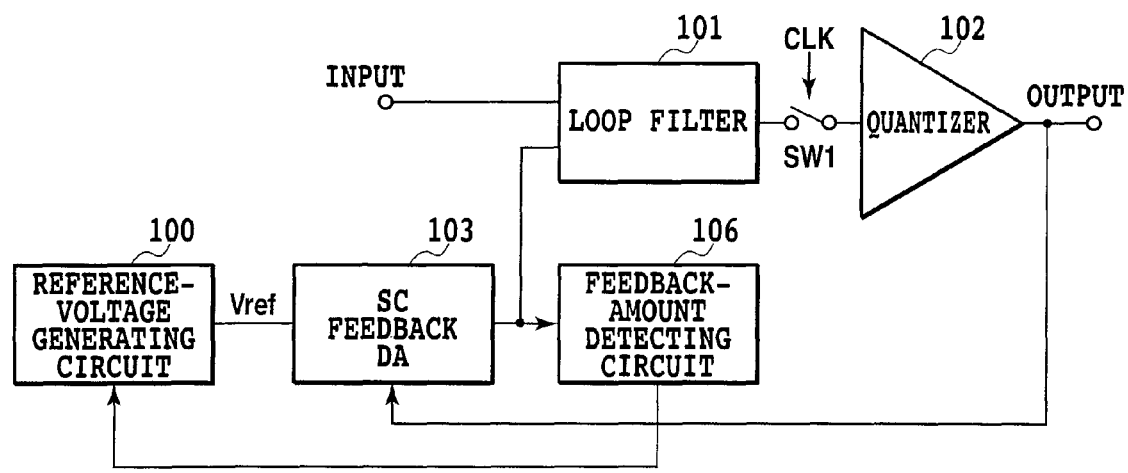
FIG. 5 is a diagram showing a configuration of a delta-sigma modulator according to a second embodiment of the present invention.

FIG. 5 shows a circuit diagram of a delta-sigma modulator according to an embodiment of the present invention. As shown in FIG. 5, the delta-sigma modulator of the present embodiment further includes a feedback-amount detecting circuit 106 detecting a feedback amount of the SC feedback DA 103, and feeds back an output of this feedback-amount detecting circuit 106 to the reference-voltage generating circuit 100. Other configuration and operation are the same as those in the first embodiment and detailed description thereof will be omitted.

Figure 6:
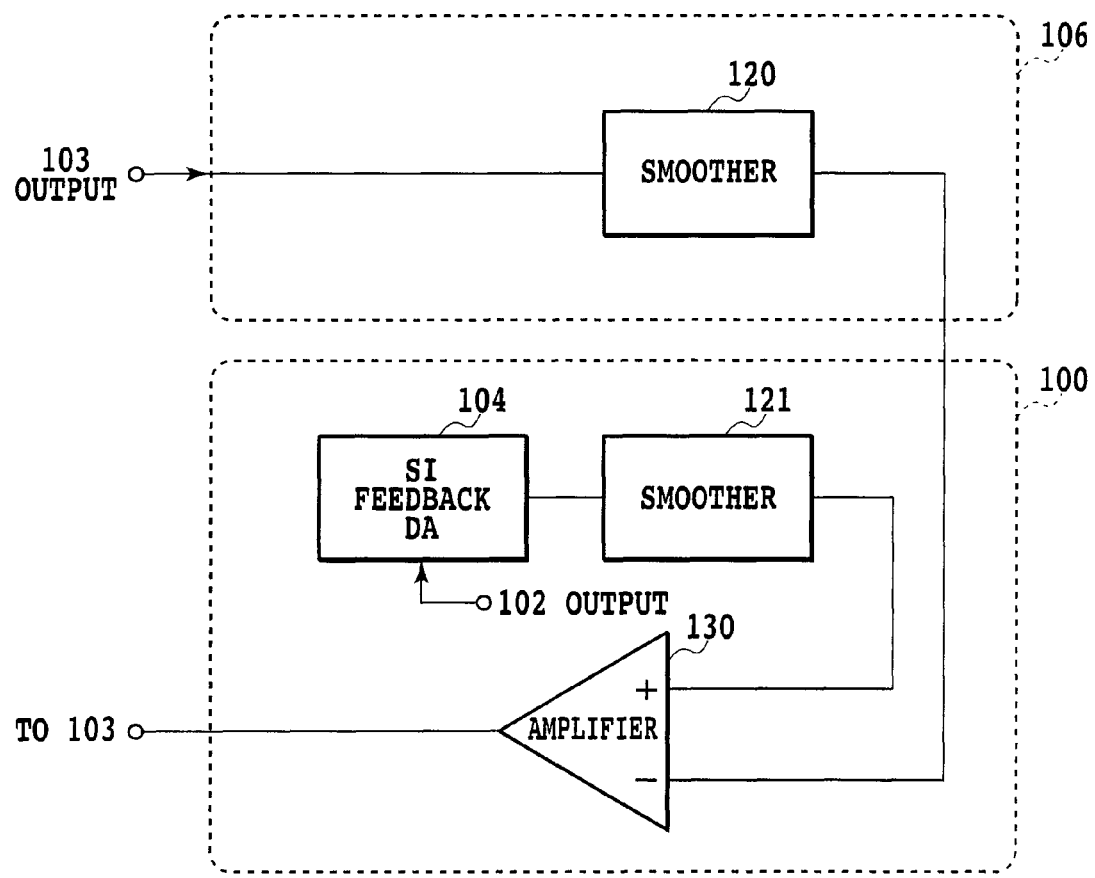
FIG. 6 is a diagram showing an example of a feedback-amount detecting circuit and reference-voltage generating circuit according to the second embodiment of the present invention.

FIG. 6 is a diagram showing an example of the feedback-amount detecting circuit 106 and reference-voltage generating circuit 100 of FIG. 5. The output of the SC feedback DA is integrated by a smoothing circuit 120 constituting the feedback-amount detecting circuit and provided to the reference-voltage generating circuit 100. Meanwhile, in the reference-voltage generating circuit 100, a SI feedback DA 104 receives the output of the quantizer 102 and outputs a charge amount originally to be fed back. This output is integrated by a smoothing circuit 121 and a difference between the integrated output and the output of the feedback-amount detecting circuit 106 is amplified by an amplifier 130. An output of this amplifier 130 is configured to be the first reference voltage Vref. Here, it may be more preferable for the embodiment further to add a capacitor to an output of the amplifier 130 for stabilizing a closed loop formed by the SC feedback DA 103, the feedback-amount detecting circuit 106, and the reference-voltage generating circuit 100, to hold the reference voltage.

Note that a connection point for the input terminal of the feedback-amount detecting circuit 106 is not limited only to the output end of the SC feedback DA as shown in FIG. 5.

Figure 7A:
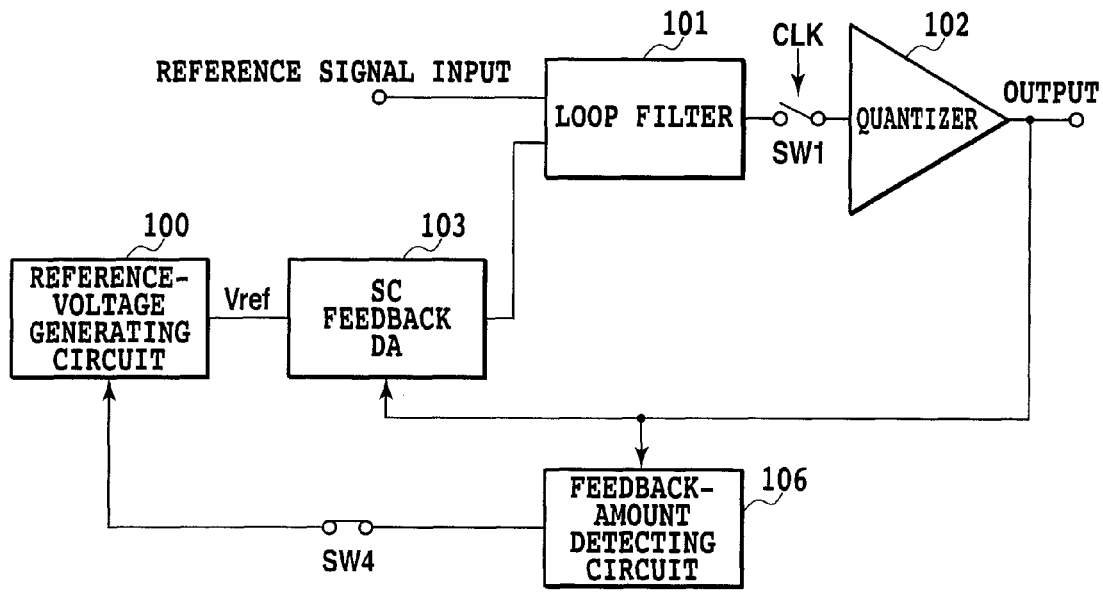
FIG. 7A is a diagram showing another example according to the second embodiment of the present invention.
Figure 7B:
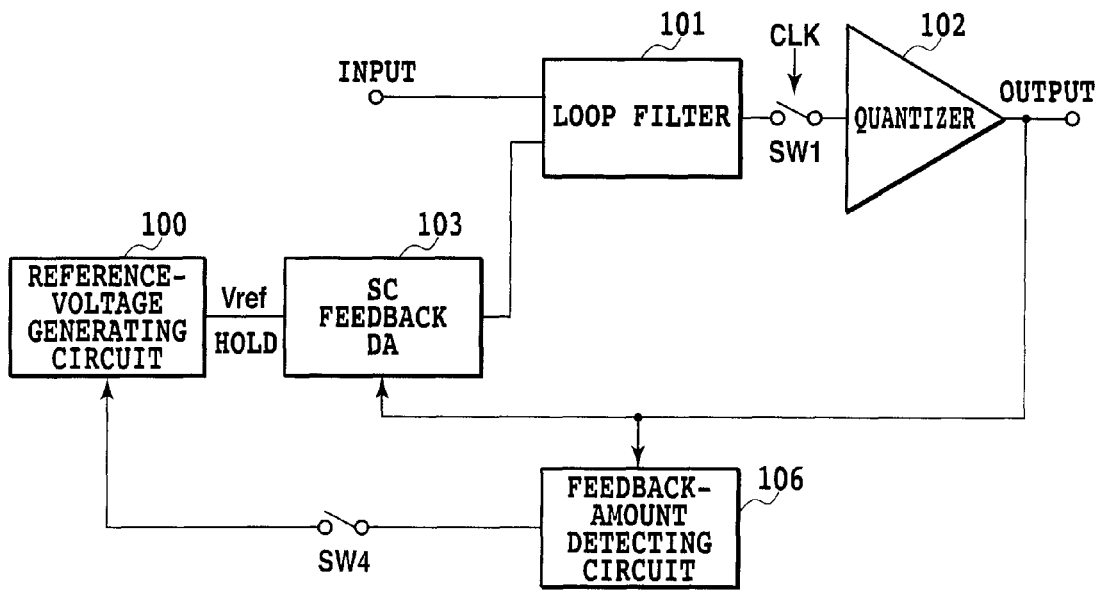
FIG. 7B is a diagram showing another example according to the second embodiment of the present invention.

FIGS. 7A and 7B show circuit diagrams in other examples of the delta-sigma modulators according to the present invention. As shown in FIGS. 7A and 7B, each of these delta-sigma modulators according to the present embodiment further includes the feedback-amount detecting circuit 106 receiving the output of the quantizer 102 and feeds back the output of this feedback-amount detecting circuit 106 to the reference-voltage generating circuit 100 via a switch SW4.

Figure 8:
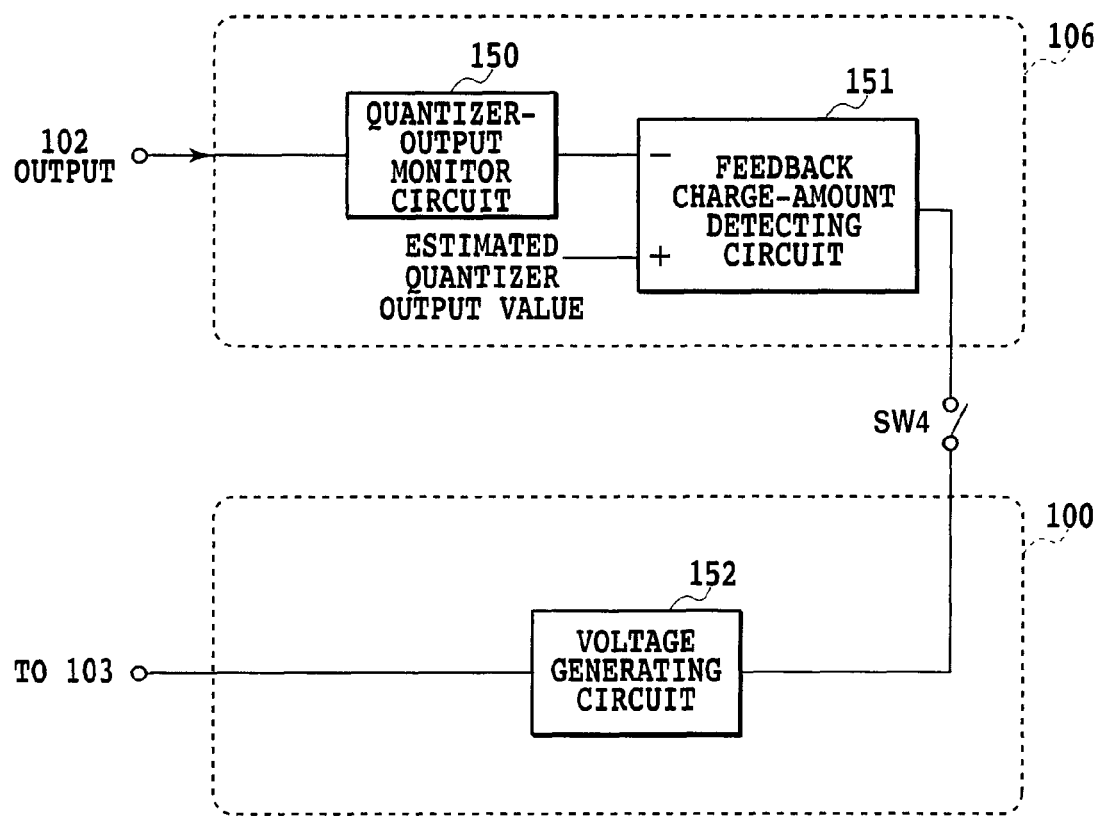
FIG. 8 is a diagram showing an example of a feedback-amount detecting circuit and reference-voltage generating circuit in the other examples according to the second embodiment of the present invention.
Figure 12A:
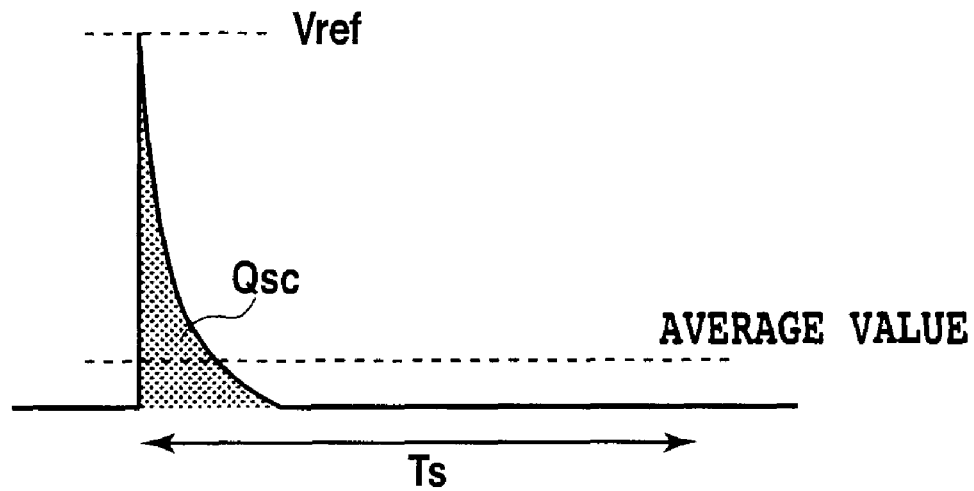
FIG. 12A is a diagram illustrating a state of negative feedback control for obtaining a constant feedback charge.
Figure 12B:
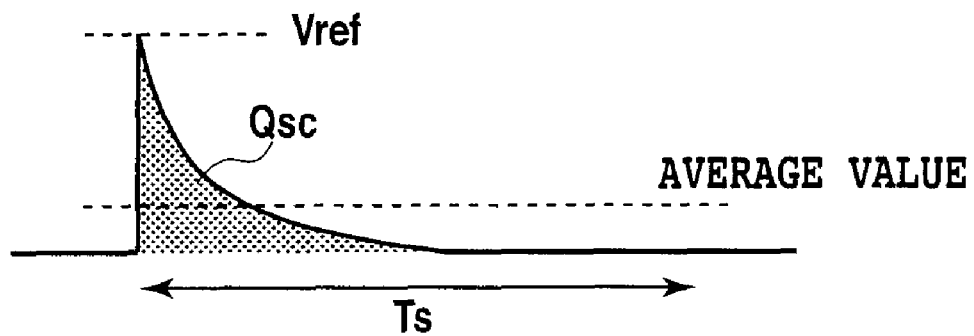
FIG. 12B is a diagram illustrating another state of negative feedback control for obtaining a constant feedback charge.

FIG. 8 is a diagram showing an example of the feedback-amount detecting circuit 106 and reference-voltage generating circuit 100 shown in FIGS. 7A and 7B. The output of the quantizer 102 is given to the reference-voltage generating circuit 100 via a quantizer-output monitor circuit and a feedback charge-amount detecting circuit constituting the feedback-amount detecting circuit. Meanwhile, in the reference-voltage generating circuit 100, an output of this feedback-amount detecting circuit 106 is input into a voltage generating circuit constituting the reference-voltage generating circuit via the switch SW4. In the present example, a reference input signal is input into the delta-sigma modulator before the delta-sigma modulator starts to operate (initial state), and the output of the quantizer 102 is monitored by the quantizer-output monitor circuit in the feedback-amount detecting circuit 106 (FIG. 7A and FIG. 8). Then, the feedback charge-amount detecting circuit in the feedback-amount detecting circuit 106 detects an actual feedback charge amount Qsc from a difference between the monitored amount and an output value estimated from the reference input signal (estimated quantizer output value). When, for this detected charge amount, a similar feedback is provided to the voltage generating circuit in the reference-voltage generating circuit 100 by turning on the switch SW4, the feedback is performed so as to increase Vref for a small time constant τ of the SC feedback DA 103 (FIG. 12A), and the feedback is performed so as adversely to decrease Vref for a large time constant τ thereof (FIG. 12B) as shown in FIGS. 12A and 12B. After the best reference voltage Vref is obtained, the switch SW4 is turned off to hold the voltage (FIG. 7B) and actual operation of the delta-sigma modulator is performed.

A holding function may be provided with the voltage generating circuit in the reference-voltage generating circuit 100 for holding the obtained reference voltage Vref, or a holding means (not shown in the drawings) may be provided with the succeeding stage of the quantizer-output monitor circuit in the feedback-amount detecting circuit 106 for holding the obtained reference voltage Vref. Also, while the switch SW4 is provided between the feedback-amount detecting circuit 106 and the reference-voltage generating circuit 100, the switch SW4 may be provided between the feedback-amount detecting circuit 106 and the quantizer 102, or provided between the voltage generating circuit and the holding means (not shown in the drawings).

By adjusting the reference voltage Vref automatically as described above, it is possible to maintain the charge amount Qsc to be fed back to the loop filter to be constant even when the absolute value of the capacitor Cfb varies due to a change in a production process thereof or the value is varied by an operating temperature condition thereof, and it is possible to provide a delta-sigma modulator with a stable operation.

Third Embodiment

Figure 9:
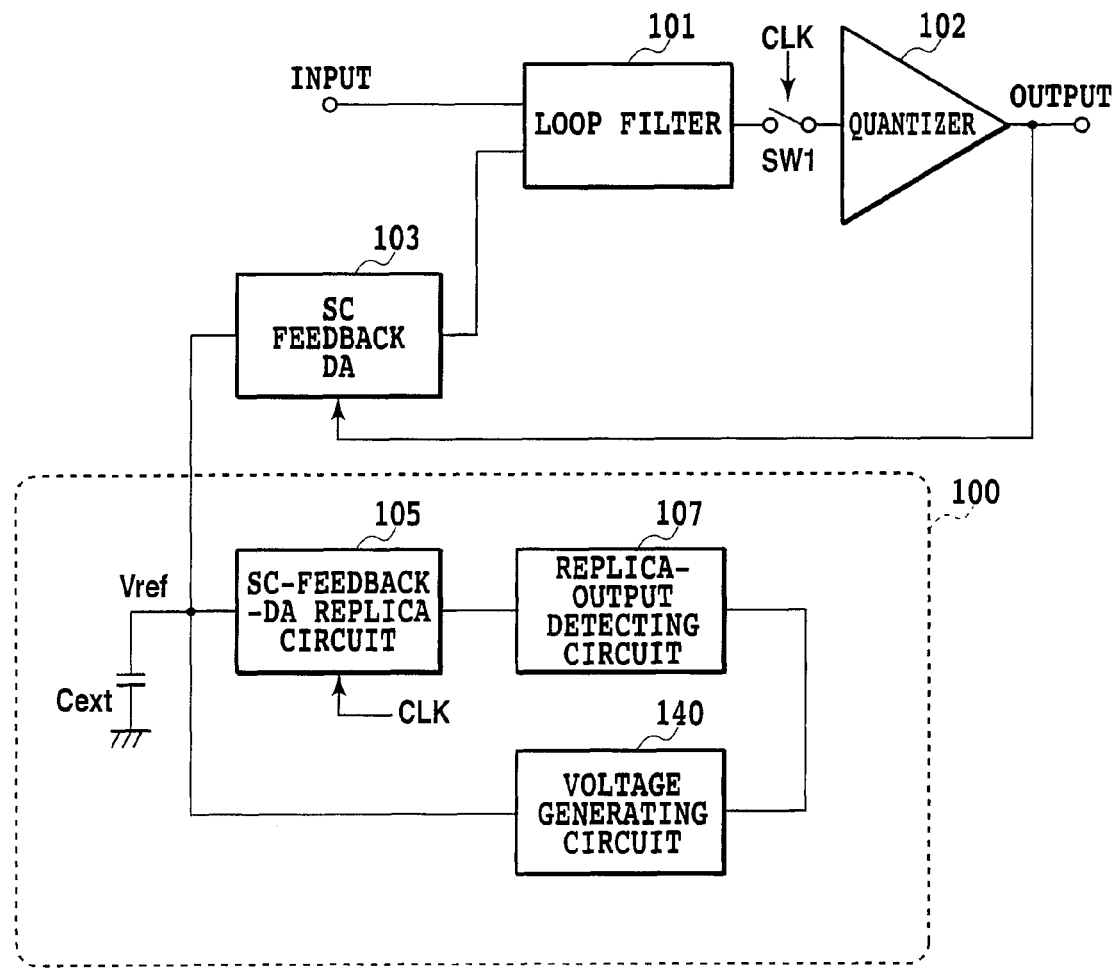
FIG. 9 is a diagram showing a configuration of a delta-sigma modulator according to a third embodiment of the present invention.

FIG. 9 shows a circuit diagram of a delta-sigma modulator according to an embodiment of the present invention. As shown in FIG. 9, the delta-sigma modulator of the present embodiment has the same configuration as that of the first embodiment except for a configuration of the reference-voltage generating circuit 100 as described below. That is, the reference-voltage generating circuit 100 includes a replica circuit 105 of the SC feedback DA 103, a replica-output detecting circuit 107 detecting a signal output from the replica circuit 105, and a voltage generator 140 generating a voltage based on the signal detected by the replica-output detecting circuit 107, and configured such that an output of the voltage generator 140 becomes the first reference voltage Vref. Here, it is more preferable for the embodiment to add a capacitance Cext to the output of the voltage generator 140 for holding the reference voltage Vref and also for improving stability of a closed loop of the reference-voltage generating circuit 100.

While the output of SC feedback DA 103 is controlled by the output of the quantizer 102, an output of the replica circuit 105 is controlled by the clock CLK.

Hereinafter, operation of the replica circuit will be described by assuming that the replica circuit has completely the same element configuration as that of the SC feedback DA.

A charge amount output from the replica circuit is monitored by the replica-output monitor circuit 107. Then, the voltage generator 140 compares the monitored charge amount with a charge amount to be fed back and performs negative feedback so as to reduce the difference thereof to zero. At this time, as shown in FIGS. 12A and 12B, the feedback is provided to the feedback DA 103 and the replica circuit 105 so as to increase Vref for a small time constant τ (FIG. 12A) and so as adversely to decrease Vref for a large time constant τ (FIG. 12B).

By adjusting the reference voltage Vref automatically as described above, it is possible to maintain the charge amount Qsc to be fed back to the loop filter to be constant even when the absolute value of the capacitor Cfb varies due to a change in a production process thereof or the value is varied by an operating temperature condition thereof, and it is possible to provide a delta-sigma modulator with a stable operation.

Fourth Embodiment

Figure 10:
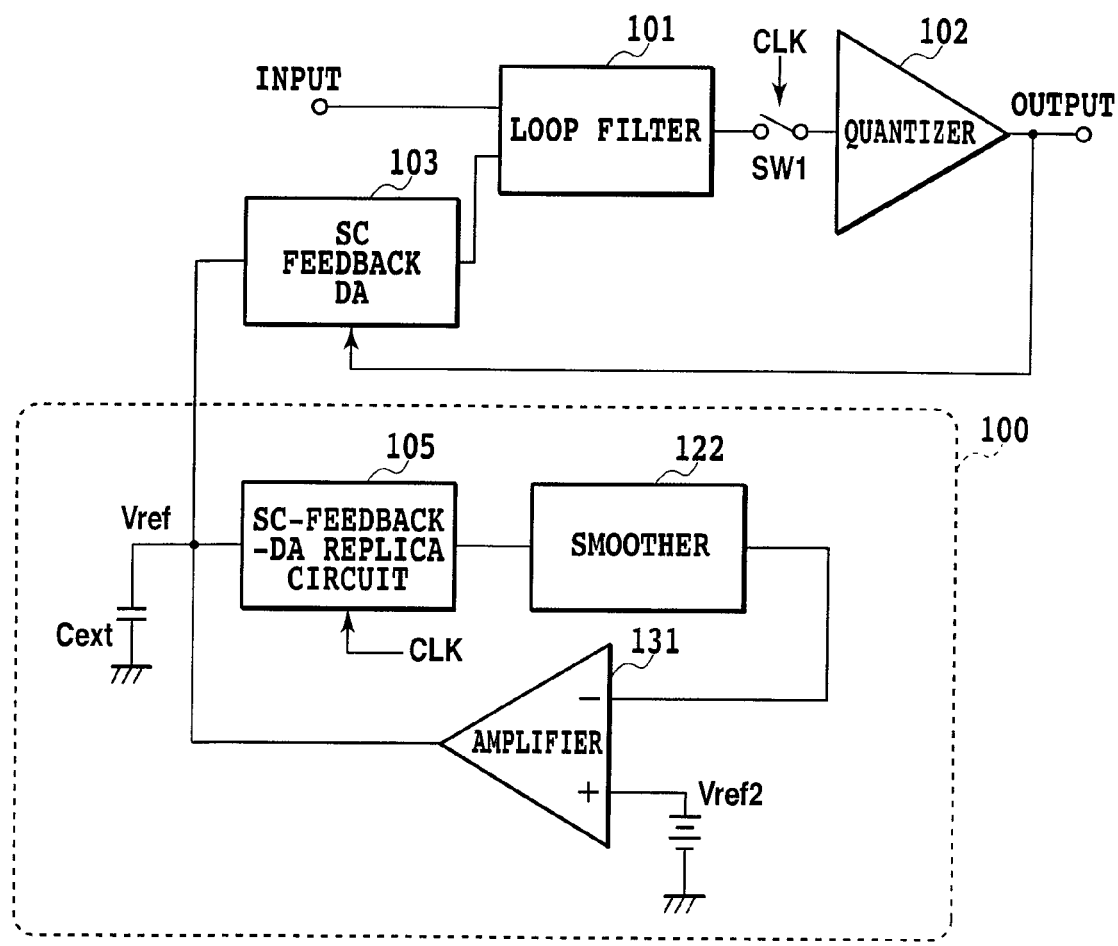
FIG. 10 is a diagram showing a configuration of a delta-sigma modulator according to a fourth embodiment of the present invention.

FIG. 10 shows a circuit diagram of a delta-sigma modulator according to an embodiment of the present invention. As shown in FIG. 10, the delta-sigma modulator of the present embodiment has the same configuration as that of the first embodiment except for a configuration of the reference-voltage generating circuit 100 as described below. That is, the reference-voltage generating circuit 100 includes a replica circuit 105 of the SC feedback DA 103, a smoothing circuit 122 smoothing a signal output from the replica circuit 105, and an amplifier 131 comparing a signal smoothed by the smoothing circuit 122 with a second reference voltage Vref2 and amplifying the difference thereof, and is configured such that an output from the amplifier 131 results in the first reference voltage Vref. Here, it may be more preferable for the embodiment to add a capacitance Cext to an output of the amplifier 131 for holding the reference voltage Vref and also for stabilizing a closed loop in the reference-voltage generating circuit 100.

While the output of the SC feedback DA 103 is controlled by the output of the quantizer 102, the output of the replica circuit 105 is controlled by the clock CLK.

Hereinafter, operation of the replica circuit will be described by assuming that the replica circuit has the same element configuration as that of the SC feedback DA.

Figure 11:
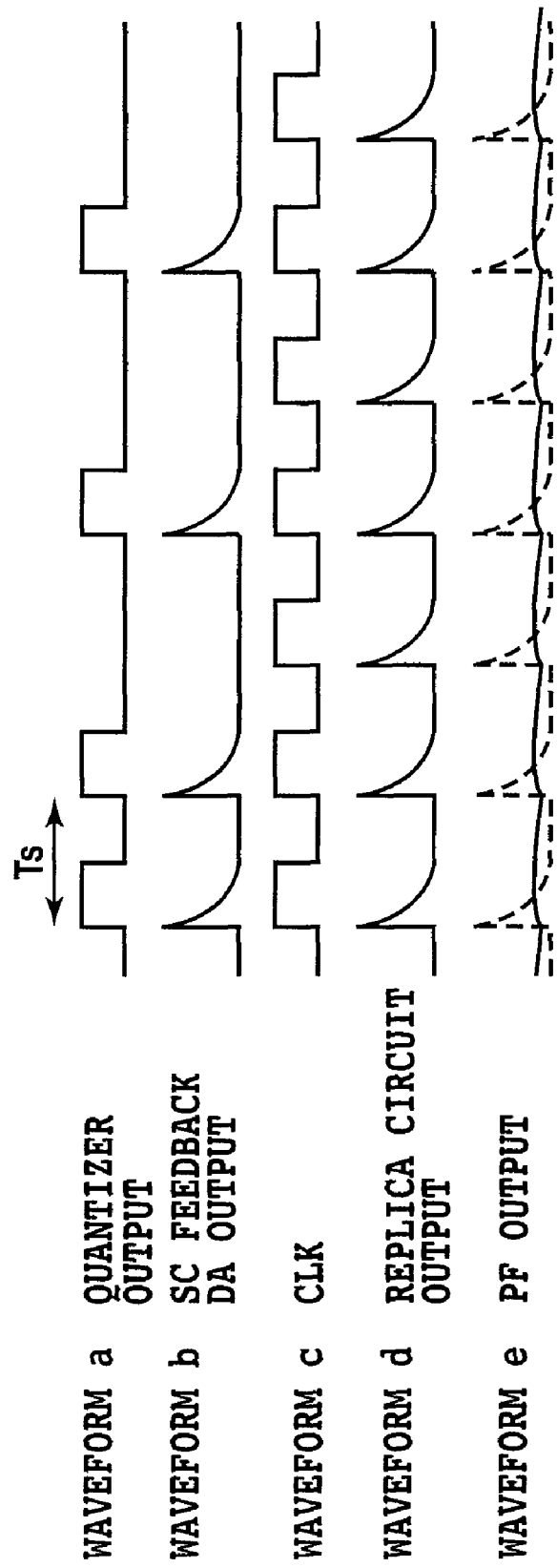
FIG. 11 is a diagram showing a state of output signal of each component in the delta-sigma modulator according to the present invention.

FIG. 11 is a diagram showing a state of each signal waveform in the delta-sigma modulator shown in FIG. 10. The output of the quantizer 102 is an RTZ (Return to zero) signal and has the same length of a Hi duration as that of the clock CLK. Further, the Hi duration is a duration in which the charge is fed back to the loop filter 101.

The output of the SC feedback DA 103 is controlled by the output of the quantizer 102 to have a waveform as shown by a waveform b in FIG. 11, and the output of the replica circuit 105 is controlled by the clock CLK to have a waveform as shown by a waveform d in FIG. 11.

The outputs of the SC feedback DA 103 and the replica circuit 105 can be easily guessed to be completely the same when compared within the clock period Ts in which the charge feedback is performed, since the SC feedback DA 103 and the replica circuit 105 have a common reference voltage Vref, the same element values constituting the both circuits 103 and 105, and the same Hi duration length of the control signals thereof.

Further, by making the both circuits 103 and 105 completely the same not only in the element values but also in layouts on a chip, it is generally possible to maintain a mismatch amount of the absolute element values thereof in a favorable range even when the absolute element value varies due to a change of a production process thereof. Also, when the both circuits 103 and 105 are formed on the same chip, temperature environments thereof are also considered to be the same. Therefore, the output signals of the both circuits 103 and 105 are considered to be always the same not depending on the change in the production process or an operating temperature condition thereof.

Here, when the output of the replica circuit 105 is input into the smoothing circuit 122, a smoothed signal exhibits a waveform like a waveform e shown in FIG. 11. Summation of a charge amount which moves every Ts does not change between before and after the smoothing.

Further, when a difference between a signal voltage of this waveform e and the second reference voltage Vref2 is amplified by the amplifier 131 and fed back negatively to Cext which holds the reference voltage, the feedback is provided to the SC feedback DA 103 and the replica circuit 105 so as to increase Vref for a small time constant τ (FIG. 12A) and so as adversely to decrease Vref for a large time constant τ (FIG. 12B) as shown in FIGS. 12A and 12B.

As described above, even when the time constant τ varies depending on the change in the production process, the operating temperature condition, or the like, the feedback charge amount Qsc is always controlled automatically to become equivalent to a charge amount to be fed back and it becomes possible to provide a stable delta-sigma modulator.

While the circuit operation has been described hereinabove by the assumption that the element configuration of the replica circuit is completely the same as that of the feedback DA, it is obvious that the element configuration of the replica circuit is not limited to completely the same configuration as that of the SC feedback DA. For example, by an element configuration in which the charge amount output from the replica circuit is just a half of the feedback charge amount from the SC feedback DA and correspondingly also by making the second reference voltage just a half, the above object can be obviously achieved.

Although the above embodiment aims to make a feedback gain to be constant, it may be possible to provide the delta-sigma modulator with a function of a VGA (Variable Gain Amplifier) by intentionally changing the second reference voltage Vref2.

Fifth Embodiment

Figure 13:
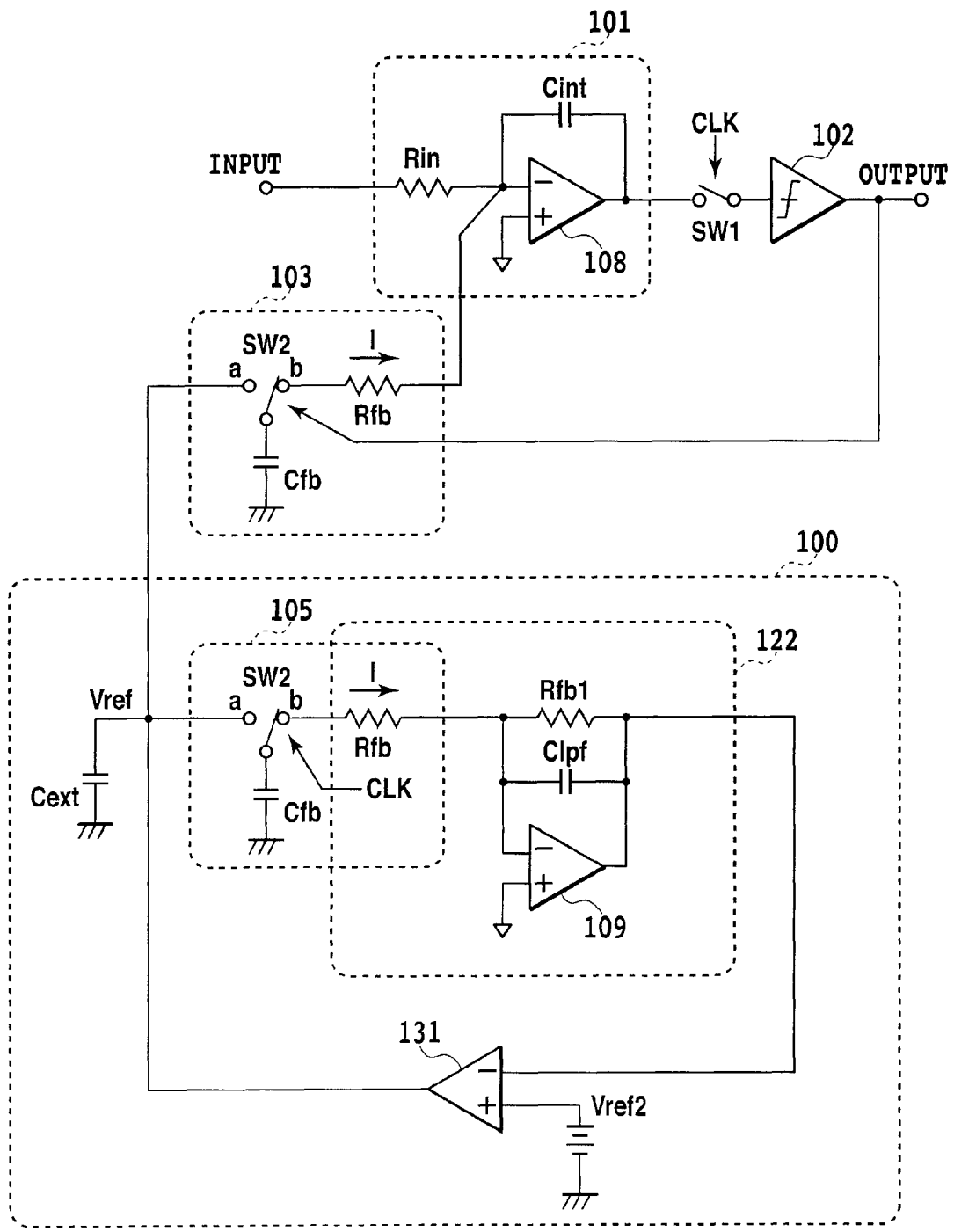
FIG. 13 is a diagram showing a configuration of a delta-sigma modulator according to a fifth embodiment of the present invention.

FIG. 13 shows a circuit diagram of a delta-sigma modulator according to an embodiment of the present invention. As shown in FIG. 13, in the delta-sigma modulator of the present embodiment, a loop filter 101 is composed of a continuous-time integrator including a resistor Rin, a capacitor Cint, and a differential amplifier 108, and a smoothing circuit 122 is composed of a resistor Rfb1, a capacitor Clpf, and a differential amplifier 109. Other configuration is the same as that of the fourth embodiment and detailed description thereof will be omitted.

Although FIG. 13 shows a first order RC integrator as the loop filter 101, a configuration and order of the loop filter is not restricted and the configuration may be a low-pass filter, band-pass filter, or the like not limited to an integrator. Also, the resistor Rin is not limited to a resistor made of poly-silicon formed on a chip and may be a metal wiring or a MOS transistor operated in a triode region, for example.

The operation principle and effect of each circuit is the same as that of the fourth embodiment and description thereof will be omitted.

Sixth Embodiment

Figure 14:
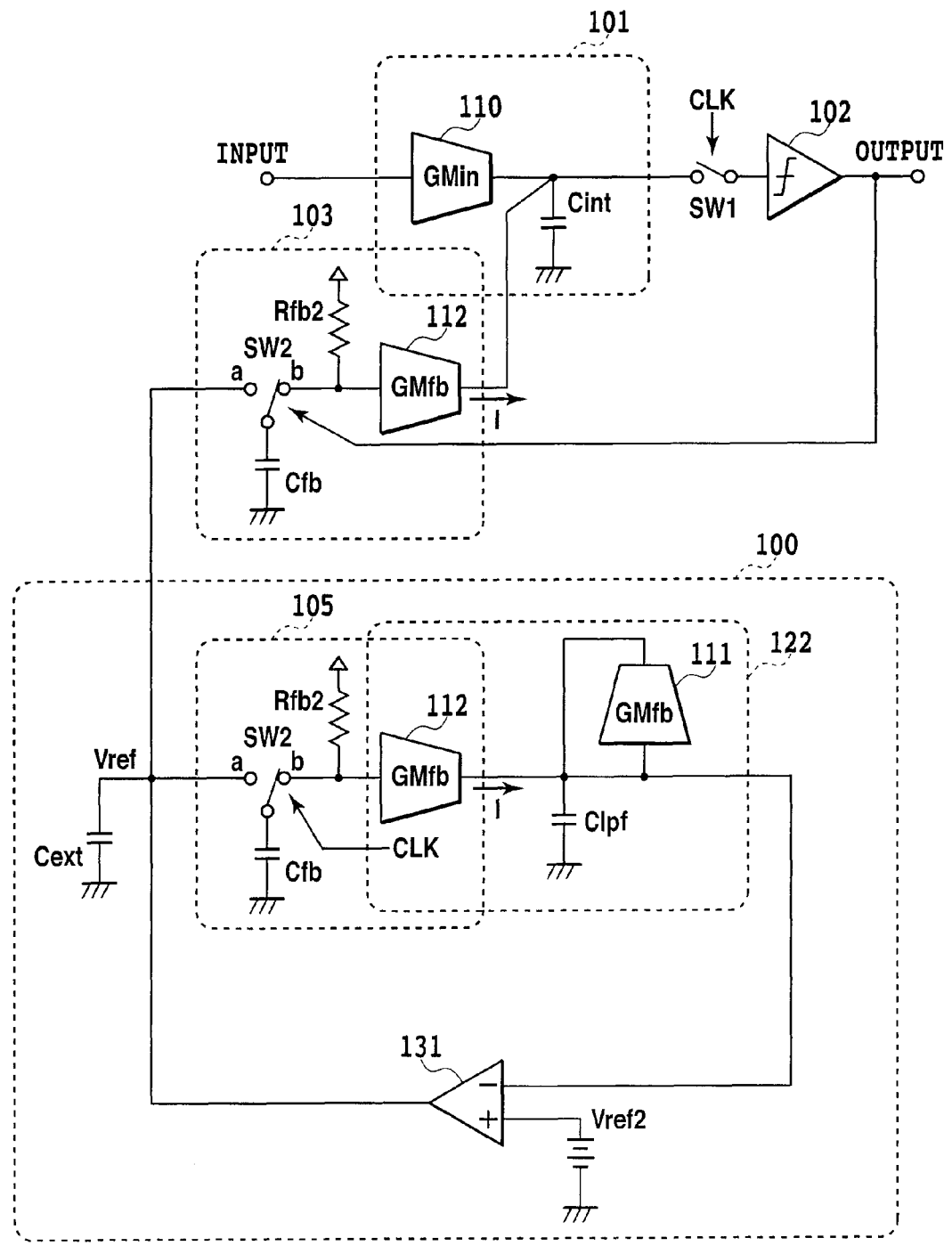
FIG. 14 is a diagram showing a configuration of a delta-sigma modulator according to a sixth embodiment of the present invention.

FIG. 14 shows a circuit diagram of a delta-sigma modulator according to an embodiment of the present invention. As shown in FIG. 14, in the delta-sigma modulator of the present embodiment, in the fourth embodiment, the loop filter 101 is composed of a continuous-time integrator including a transconductance amplifier 110 (transconductance thereof is denoted by GMin) and a capacitor Cint, the smoothing circuit 122 is composed of a transconductance amplifiers 111 and 112 (transconductance thereof is denoted by GMfb) and a capacitor Clpf, and the SC feedback DA 103 and the replica circuit 105 are configured as described below. Here, the transconductance amplifier 112 is shared by the smoothing circuit 122 and the replica circuit 105. Other configuration is the same as that of the fourth embodiment.

There will be described a specific circuit example and circuit operation of the SC feedback DA 103 in the present embodiment with reference to FIG. 15A and FIG. 15B, respectively.

The SC feedback DA 103 of the present embodiment includes a capacitor Cfb, a resistor Rfb2 attenuating a charge stored in the capacitor Cfb, a transconductance amplifier 112 (transconductance thereof is denoted by GMfb) and a switch SW2 switching in response to the output signal of the quantizer 102.

Here, a parasitic capacitor added to a node Nfb of the input terminal of the transconductance amplifier 112 is denoted by Cp.

A charge stored by the reference voltage Vref is fed back to the loop filter 101 according to an resulting output of the quantizer 102. At the moment when the switch SW2 is connected to the b-terminal, the stored charge is shared by the capacitor Cfb and the parasitic capacitor Cp and a voltage Vfb (t=0) at the node Nfb is represented as Vfb (t=0)=Vref×Cfb/(Cfb+Cp). This voltage is converted into current by the transconductance amplifier 112, and a current I (t=0) at the moment when the switch SW2 is connected to the b-terminal is represented as I (t=0)=GMfb×Vref×Cfb/(Cfb+Cp).

Then, while the switch SW2 is connected to the b-terminal, a current amount fed back to the loop filter 101 is represented as follows by use of a time constant τ2 (=Rfb2×(Cfb+Cp)) determined by the capacitor Cfb, parasitic capacitor Cp, and resistor Rfb2.

$$I = \{GMfb \times Vref \times Cfb/(Cfb+Cp)\} \times \exp(-t/\tau 2)$$

The charge amount Qsc fed back to the loop filter every clock CLK period Ts is calculated as follows by a temporal integral of the above current value in a charge feedback duration.

$$Qsc=\int[\{GMfb \times Vref \times Cfb/(Cfb+Cp)\} \times \exp(-t/\tau 2)]dt$$

Here, when the time constant τ2 is assumed to be sufficiently small compared with a length of the charge feedback duration, the charge amount Qsc is given as follows.

$$Qsc = \{GMfb \times Vref \times Cfb/(Cfb+Cp)\} \times \tau 2$$
$$= GMfb \times Vref \times Cfb \times Rfb2$$

It is preferable to configure the replica circuit 105 by using completely the same elements as those of the SC feedback DA 103. Operations of the SC feedback DA 103 and the replica circuit 105 configured in this manner are the same as those in the fourth embodiment described with reference to FIG. 11, and detailed description thereof will be omitted.

Although FIG. 14 shows a first order Gm-C integrator as the loop filter, a low-pass filter, band-pass filter, or the like, not limited to the integrator can be applied and a configuration and order of the loop filter do not have any restriction.

It is generally difficult to predict the value of the parasitic capacitance Cp generated at the input terminal of the transconductance amplifier in each of the both circuits 103 and 105. Also, there is a possibility that a current amount error is caused by an insufficient linear input range of the transconductance amplifier.

However, if the transconductance amplifiers in the feedback circuit 103 and the replica circuit 105 are the same and peripheral layouts thereof are the same, the parasitic capacities and the current amount errors caused by the insufficient input range are considered to be the same in the both circuits. Therefore, even if the charge amount fed back to the loop filter is varied by these causes, variation can be automatically adjusted to be cancelled.

Seventh Embodiment

In a delta-sigma modulator according to the present embodiment, the loop filter 101 is configured by a sequential connection of a continuous-time filter including a resistor, capacitor, and operational amplifier and a continuous-time filter including a transconductance amplifier and capacitor.

The other configuration is the same as that of the fourth embodiment. Here, the sequential connection may be a series connection or a cascade connection.

A configuration and order of the loop filter have no restriction. Also, the resistor is not limited to a resistor made of poly-silicon formed on a chip and may be a metal wiring or a MOS transistor operated in a triode region, for example.

The operation principle and effect of each circuit are the same as those of the fourth embodiment and description thereof will be omitted.

Eighth Embodiment

A delta-sigma modulator according to the present embodiment includes a continuous-time loop filter 101 capable of processing a continuous-time signal, a switch SW1 sampling an output signal thereof in response to a clock CLK, a quantizer 102 quantizing the signal obtained via the switch SW1 to output a digital signal, and an SC (SCR) feedback DA 103 generating a current to be fed back to the loop filter 101 based on the digital signal output from the quantizer 102 to feed back the current to the loop filter 101.

Figure 15A:
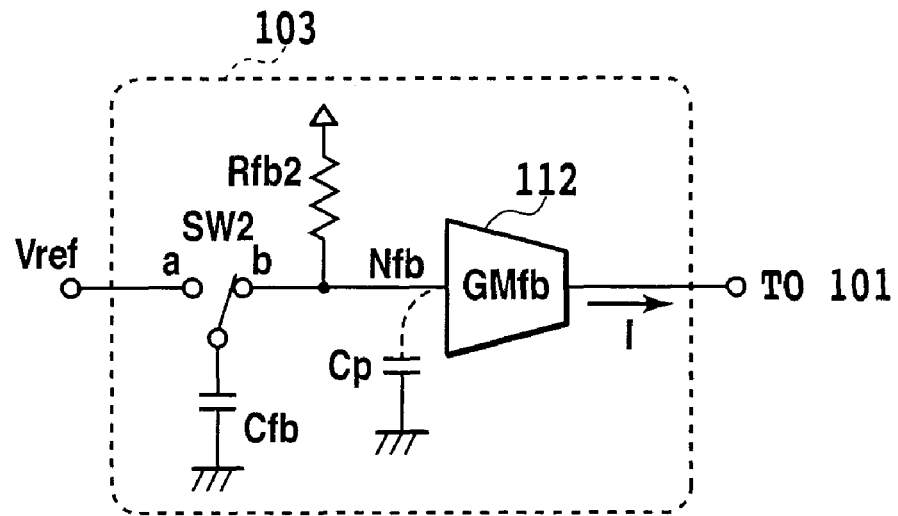
FIG. 15A is a circuit diagram illustrating an SC feedback DA in the sixth and eighth embodiments.

FIG. 15A is a diagram showing a specific circuit configuration of the SC feedback DA 103 of the present embodiment. Circuit operation thereof will be described with reference to FIG. 15A.

The SC feedback DA 103 of the present embodiment includes a capacitor Cfb, a resistor Rfb2 attenuating a charge stored in the capacitor Cfb, a transconductance amplifier 112 (transconductance thereof is denoted by GMfb), and a switch SW2 switching in response to an output signal of the quantizer 102.

Here, a parasitic capacitance added to a node Nfb of an input terminal of the transconductance amplifier 112 is denoted by Cp.

Figure 15B:
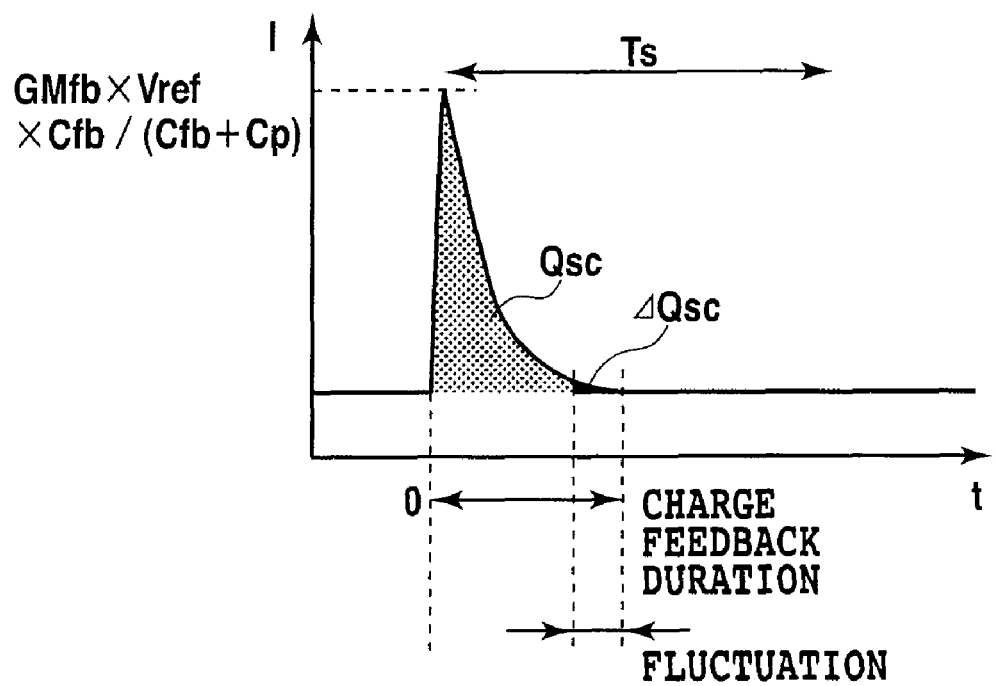
FIG. 15B is a diagram illustrating operation of the SC feedback DA in the sixth and eighth embodiments.

With reference to FIG. 15B, there will be described circuit operation of the SC feedback DA 103 of the present embodiment. A charge stored by the reference voltage Vref is fed back to the loop filter 101 according to an resulting output of the quantizer 102. At the moment when the switch SW2 is connected to the b-terminal, the stored charge is shared by the capacitor Cfb and the parasitic capacitance Cp and a voltage Vfb (t=0) at the node Nfb is represented as Vfb (t=0)=Vref×Cfb/(Cfb+Cp). This voltage is converted into current by the transconductance amplifier 112, and a current I (t=0) at the moment when the switch SW2 is connected to the b-terminal is represented as I (t=0)=GMfb×Vref×Cfb/(Cfb+Cp).

Then, while the switch SW2 is connected to the b-terminal, a current amount fed back to the loop filter 101 is represented as follows by use of a time constant τ2 (=Rfb2×(Cfb+Cp) determined by the capacitor Cfb, parasitic capacitance Cp, and resistor Rfb2.

$$I=\{GMfb \times Vref \times Cfb/(Cfb+Cp)\} \times \exp(-t/\tau 2)$$

The charge amount Qsc fed back to the loop filter every clock CLK period Ts is calculated as follows by a temporal integral of the above current value in a charge feedback duration.

$$Qsc=\int[\{GMfb \times Vref \times Cfb/(Cfb+Cp)\} \times \exp(-t/\tau 2)]dt$$

Here, when the time constant τ2 is assumed to be sufficiently small compared to a length of the charge feedback duration, the charge amount Qsc is given as follows.

$$Qsc = \{GMfb \times Vref \times Cfb/(Cfb+Cp)\} \times \tau 2$$
$$= GMfb \times Vref \times Cfb \times Rfb2$$

By configuring the SC feedback DA 103 as described above, it is possible to make a first stage integrator of the loop filter 101 to have a Gm-C configuration. Generally, the Gm-C integrator which does not have a feedback loop is more suitable for high speed operation than a RC integrator, and thereby the present embodiment can provide a delta-sigma modulator having a high-speed SC feedback DA with low power consumption.

When a higher order loop filter is required and the loop filter is configured with an RC integrator for the first stage and a GM-C integrator for a remaining stage, there is a case in which a mismatch in the characteristics of the integrators may be a cause of changing a transfer function of the loop filter. Then, this change in the transfer function provides an influence to a quantization noise within a frequency band thereof and, in the worst case, this influence causes a problem.

The present embodiment can provide a delta-sigma modulator having an SC feedback DA configured with Gm-C integrators for all the stages thereof. Thereby, the present embodiment has excellent advantages that a canceling circuit is not necessary for canceling the mismatch in the characteristics of the integrators among the stages and that the mismatch is originally not caused in the characteristics of the integrators among the stages.

Industrial Applicability

The present invention can be applied to an AD converter or a DA converter used for an electronic equipment.

The invention claimed is:

1. A delta-sigma modulator, comprising:
an input terminal;
a continuous-time loop filter for receiving a continuous-time signal from said input terminal;
a quantizer for outputting a digital signal obtained by quantizing an output from said continuous-time loop filter in response to a clock;
a switched-capacitor feedback DA converter for outputting an analog signal depending on a first reference voltage according to the digital signal output from said quantizer, and for feeding back the analog signal to said continuous-time loop filter, said switched-capacitor feedback DA converter having a capacitor and a resistor; and
a reference-voltage generating circuit for generating said first reference voltage,
said reference-voltage generating circuit including a replica circuit of said switched-capacitor feedback DA converter, a detecting circuit for detecting a signal output from said replica circuit, and a voltage generator for generating a reference voltage based on the signal detected by said detecting circuit, an output from said voltage generator being said first reference voltage and also being input into said replica circuit;
wherein said switched-capacitor feedback DA converter attenuating the output signal to be fed back to said continuous-time loop filter according to a time constant determined by said capacitor and said resistor, and
said first reference voltage being variable.

2. A delta-sigma modulator, comprising:
an input terminal;
a continuous-time loop filter for receiving a continuous-time signal from said input terminal;
a quantizer for outputting a digital signal obtained by quantizing an output from said continuous-time loop filter in response to a clock;
a switched-capacitor feedback DA converter for outputting an analog signal depending on a first reference voltage according to the digital signal output from said quantizer, and for feeding back the analog signal to said continuous-time loop filter, said switched-capacitor feedback DA converter having a capacitor and a resistor; and
a reference-voltage generating circuit for generating said first reference voltage,
said reference-voltage generating circuit including a replica circuit of said switched capacitor feedback DA converter, a smoothing circuit for smoothing a signal output from said replica circuit, and an amplifier for comparing the signal smoothed by said smoothing circuit with a second reference voltage and for amplifying a difference therebetween, an output from said amplifier being said first reference voltage and also being input into said replica circuit;
wherein said switched-capacitor feedback DA converter attenuating the output signal to be fed back to said continuous-time loop filter according to a time constant determined by said capacitor and said resistor, and
said first reference voltage being variable.

3. The delta-sigma modulator according to claim 2, wherein said second reference voltage is variable.

4. The delta-sigma modulator according to claim 2, wherein each of said switched-capacitor feedback DA converter and said replica circuit has a capacitor, a resistor and a transconductance amplifier, converts a voltage signal attenuated according to a time constant determined by said capacitor and said resistor into a current with said transconductance amplifier, and outputs the current to said continuous-time loop filter, respectively.

5. The delta-sigma modulator according to claim 4, wherein each of said continuous-time loop filter and said smoothing circuit includes a capacitor and a transconductance amplifier, respectively.

6. A delta-sigma modulator, comprising:
an input terminal;
a continuous-time loop filter for receiving a continuous-time signal from said input terminal;
a quantizer for outputting a digital signal obtained by quantizing an output from said continuous-time loop filter in response to a clock;
a switched-capacitor feedback DA converter for outputting an analog signal depending on a first reference voltage according to the digital signal output from said quantizer, and for feeding back the analog signal to said continuous-time loop filter, said switched-capacitor feedback DA converter having a capacitor and a resistor; and
a feedback-amount detecting circuit for detecting a signal output from said switched-capacitor feedback DA converter, and a reference voltage generator for generating the first reference voltage based on the signal detected by said first feedback-amount detecting circuit;
wherein said switched-capacitor feedback DA converter attenuating the output signal to be fed back to said continuous-time loop filter according to a time constant determined by said capacitor and said resistor, and
said first reference voltage being variable.

7. The delta-sigma modulator according to claim 6, wherein said feedback-amount detecting circuit includes a first smoothing circuit for smoothing the signal output from said switched-capacitor feedback DA converter and
said reference voltage generator includes a switched-current feedback DA converter for DA-converting the digital signal output from said quantizer, a second smoothing circuit for smoothing a signal output from said switched-current feedback DA converter, and a first amplifier for comparing signals output from said first with signals output from second smoothing circuits,
an output from said amplifier being said first reference voltage.

8. A delta-sigma modulator, comprising:
an input terminal;
a continuous-time loop filter for receiving a continuous-time signal from said input terminal:
a quantizer for outputting a digital signal obtained by quantizing an output from said continuous-time loop filter in response to clock.
a switched-capacitor feedback DA converter for outputting an analog signal depending on a first reference voltage according to the digital signal output from said quantizer, and for feeding back the analog signal to said continuous-time loop filter, said switched-capacitor feedback DA converter having a capacitor and a resistor: and a second feedback-amount detecting circuit for detecting the signal output from said quantizer when a reference signal is input into said continuous-time loop filter and a reference voltage generator for generating the first reference voltage based on a signal detected by said second feedback-amount detecting circuit, said reference voltage generator holds said first reference voltage generated;

wherein said switched-capacitor feedback DA converter attenuating the output signal to be fed back to said continuous-time loop filter according to a time constant determined by said capacitor and said resistor, and said first reference voltage being variable.

9. The delta-sigma modulator according to claim 8, wherein said feedback-amount detecting circuit includes a quantizer-output monitor circuit for monitoring the digital signal output from said quantizer and a feedback charge-amount detecting circuit for detecting a charge amount fed back from a difference between an output of said quantizer-output monitor circuit and an output value estimated from the input reference signal;

said reference voltage generator includes a voltage generating circuit for generating a voltage based on an output value from said second feedback-amount detecting circuit; and an output of said voltage generating circuit being said first reference voltage.

10. A delta-sigma modulator, comprising:

an input terminal;

a continuous-time loop filter for receiving a continuous-time signal from said input terminal;

a quantizer for outputting a digital signal obtained by quantizing an output from said continuous-time loop filter in response to a clock; and a switched-capacitor feedback DA converter for outputting an analog signal depending on a first reference voltage according to the digital signal output from said quantizer, and for feeding back the analog signal to said continuous-time loop filter, said switched-capacitor feedback DA converter having a capacitor and a resistor;

wherein said switched-capacitor feedback DA converter attenuating the output signal to be fed back to said continuous-time loop filter according to a time constant determined by said capacitor and said resistor, and said first reference voltage being variable, and wherein said continuous-time loop filter is configured with a first filter having a resistor, a capacitor and a differential amplifier, and a second filter having a transconductance amplifier and a capacitor, wherein said filters are sequentially connected.

* * * * *

UNITED STATES PATENT AND TRADEMARK OFFICE
CERTIFICATE OF CORRECTION

| | | |
|---|---|---|
| PATENT NO. | : 7,948,412 B2 | |
| APPLICATION NO. | : 12/279918 | |
| DATED | : May 24, 2011 | |
| INVENTOR(S) | : Yusuke Aiba | |

It is certified that error appears in the above-identified patent and that said Letters Patent is hereby corrected as shown below:

Claim 7, column 14, line 45, "6,wherein" should read --6, wherein--.

Claim 8, column 14, line 63, "clock." should read --clock;--.

Signed and Sealed this
Twenty-ninth Day of November, 2011

David J. Kappos
*Director of the United States Patent and Trademark Office*